(12) United States Patent
Wachtler et al.

(10) Patent No.: US 12,713,938 B2
(45) Date of Patent: Aug. 18, 2026

(54) SINTERED METAL FLIP CHIP JOINTS

(71) Applicant: Texas Instruments Incorporated, Dallas, TX (US)

(72) Inventors: Kurt Peter Wachtler, Richardson, TX (US); Seunghyun Chae, Allen, TX (US); Benjamin Stassen Cook, Rockwall, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 247 days.

(21) Appl. No.: 17/027,657

(22) Filed: Sep. 21, 2020

(65) Prior Publication Data

US 2021/0005537 A1 Jan. 7, 2021

Related U.S. Application Data

(63) Continuation of application No. 15/135,318, filed on Apr. 21, 2016, now abandoned.

(51) Int. Cl.
*H01L 21/00* (2006.01)
*H10W 70/40* (2026.01)
(Continued)

(52) U.S. Cl.
CPC ........ *H10W 70/411* (2026.01); *H10W 70/421* (2026.01); *H10W 70/453* (2026.01);
(Continued)

(58) Field of Classification Search
CPC ....... H01L 2224/81192; H01L 2224/97; H01L 23/49541; H01L 23/49503;
(Continued)

(56) References Cited

U.S. PATENT DOCUMENTS 5,497,258 A * 3/1996 Ju ........................ G02F 1/13452 349/149
2005/0110161 A1* 5/2005 Naito ...................... H01L 24/16 257/E23.068

(Continued)

FOREIGN PATENT DOCUMENTS

WO 199625763 8/1996

OTHER PUBLICATIONS

"3D Printing", Wikipedia, available at http://en.wikipedia.org/w/index.php?title=3D_printing&oldid=624190184, Sep. 4, 2014, pp. 1-35.

(Continued)

*Primary Examiner* — Earl N Taylor
(74) *Attorney, Agent, or Firm* — Zhenhai Fu; Frank D. Cimino

(57) ABSTRACT

An integrated circuit die may be fabricating to have a plurality of contacts. A metal post may be formed on each of the plurality of contacts. A plurality of bumps may be formed on a plurality of contact regions of a leadframe or on the posts, in which the plurality of bumps are formed with a material that includes metal nanoparticles. The IC die may be attached to the leadframe by aligning the metal posts to the leadframe and sintering the metal nanoparticles in the plurality of bumps to form a sintered metal bond between each metal post and corresponding contact region of the leadframe.

20 Claims, 10 Drawing Sheets

(51) Int. Cl.

| | |
|---|---|
| *H01L 23/00* | (2006.01) |
| *H01L 23/495* | (2006.01) |
| *H01L 23/538* | (2006.01) |
| *H10W 70/60* | (2026.01) |
| *H10W 70/685* | (2026.01) |
| *H10W 72/00* | (2026.01) |
| *H10W 72/20* | (2026.01) |
| *H10W 74/00* | (2026.01) |
| *H10W 90/00* | (2026.01) |

(52) U.S. Cl.

CPC ........ *H10W 70/611* (2026.01); *H10W 70/685* (2026.01); *H10W 72/01223* (2026.01); *H10W 72/01225* (2026.01); *H10W 72/01235* (2026.01); *H10W 72/01255* (2026.01); *H10W 72/016* (2026.01); *H10W 72/01935* (2026.01); *H10W 72/01938* (2026.01); *H10W 72/0198* (2026.01); *H10W 72/072* (2026.01); *H10W 72/07235* (2026.01); *H10W 72/222* (2026.01); *H10W 72/224* (2026.01); *H10W 72/234* (2026.01); *H10W 72/241* (2026.01); *H10W 74/00* (2026.01); *H10W 90/726* (2026.01)

(58) Field of Classification Search

CPC ..... H01L 2924/18162; H01L 2924/181; H01L 23/49572; H01L 24/11; H01L 24/81; H01L 23/5383; H01L 24/13; H01L 24/16; H01L 2021/60022; H01L 2224/0345; H01L 2224/03462; H01L 2224/11318; H01L 2224/11332; H01L 2224/11462; H01L 2224/1147; H01L 2224/13017; H01L 2224/13076; H01L 2224/13082; H01L 2224/16245; H01L 2224/81097; H01L 2224/81191; H01L 2224/81193; H01L 2224/8122; H01L 2224/8184; H01L 2224/05647; H01L 2224/13124; H01L 2224/13144; H01L 2224/13147; H01L 2224/13155; H01L 2224/13199; H01L 2224/13339; H01L 2224/13347; H01L 2224/13386; H01L 2224/8084; H01L 2224/8284; H01L 2224/8384; H01L 2224/8484; H01L 2224/8584; H01L 2224/8684; H01L 2224/03505; H01L 2224/11505; H01L 2224/27505; H01L 2224/3551; H01L 2224/4351

See application file for complete search history.

(56) References Cited

U.S. PATENT DOCUMENTS

| | | | | |
|---|---|---|---|---|
| 2005/0266605 | A1* | 12/2005 | Kawakami ............. | B82Y 10/00 257/E21.314 |
| 2006/0246695 | A1* | 11/2006 | Kim ..................... | H05K 3/3485 438/584 |
| 2008/0054458 | A1* | 3/2008 | Ozaki ..................... | H01L 24/10 257/737 |
| 2010/0006994 | A1* | 1/2010 | Shim ..................... | H01L 21/561 257/676 |
| 2011/0012246 | A1* | 1/2011 | Andrews, Jr. ........... | H01L 24/24 257/676 |
| 2012/0018864 | A1* | 1/2012 | Krishnan .......... | H01L 23/49513 977/932 |
| 2012/0086041 | A1* | 4/2012 | Isogai .................. | H10H 20/857 257/E33.066 |
| 2013/0000952 | A1* | 1/2013 | Srinivas ............. | H10K 59/8051 174/126.1 |
| 2014/0077351 | A1* | 3/2014 | Haba ....................... | H01L 24/17 977/773 |
| 2014/0090871 | A1* | 4/2014 | Zhao ................... | H10K 30/821 174/126.2 |
| 2014/0196658 | A1* | 7/2014 | Grimes .................... | B01J 35/70 117/7 |
| 2014/0335660 | A1* | 11/2014 | Krishnan ................ | H01L 24/84 427/369 |
| 2016/0099466 | A1* | 4/2016 | Kim ...................... | H01M 4/366 252/507 |
| 2016/0192496 | A1* | 6/2016 | Wang ...................... | H01L 24/92 361/767 |
| 2017/0250128 | A1* | 8/2017 | Fontana ............ | H01L 23/49541 |
| 2018/0374813 | A1* | 12/2018 | Khazaka ............. | H01L 21/4846 |
| 2021/0005537 | A1* | 1/2021 | Wachtler ........... | H01L 23/49572 |

OTHER PUBLICATIONS

Jacob Sadie and Vivek Subramanian, "Inkjet Printing for Advanced Semiconductor Packaging: Pillars and Through-Silicon Vias (TSVs)", Jun. 12, 2014, pp. 1-19.

International Search Report for PCT/US2017/029000 mailed Jul. 13, 2017.

* cited by examiner

SINTERED METAL FLIP CHIP JOINTS

This application is a continuation of U.S. patent application Ser. No. 15/135,318, filed Apr. 21, 2016, the contents of which are herein incorporated by reference in its entirety.

FIELD OF THE INVENTION

This disclosure relates to bonding metal contact posts of a semiconductor die to a metal leadframe in a flip chip configuration, and in particular to using sintered metal to form a solder free bond between the metal posts on the die and the leadframe.

BACKGROUND OF THE INVENTION

Flip chip is a method for interconnecting semiconductor devices, such as IC chips and micro-electromechanical systems (MEMS), to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), it is flipped over so that its top side faces down, and aligned so that its pads align with matching pads on the external circuit or leadframe, and then the solder is reflowed to complete the interconnect. This is in contrast to wire bonding, in which the chip is mounted upright and wires are used to interconnect the chip pads to external circuitry or lead frame.

Processing a flip chip is similar to conventional IC fabrication, with a few additional steps. Near the end of the manufacturing process, the attachment pads are metalized to make them more receptive to solder. This typically consists of several treatments. More recently, a process is used in which metal posts are formed on each metalized attachment pad to extend the height of the contact. A small dot of solder is then deposited on each metalized pad. Alternatively, the solder dots may be placed on the leadframe. The chips are then cut out of the wafer as normal.

To attach the flip chip into a circuit, the chip is inverted to bring the solder dots down onto connectors on the underlying leadframe or circuit board. The solder is then re-melted to produce an electrical connection, typically using a Thermosonic bonding or alternatively a reflow solder process.

BRIEF DESCRIPTION OF THE DRAWINGS

Particular embodiments in accordance with the invention will now be described, by way of example only, and with reference to the accompanying drawings.

Figure 1:
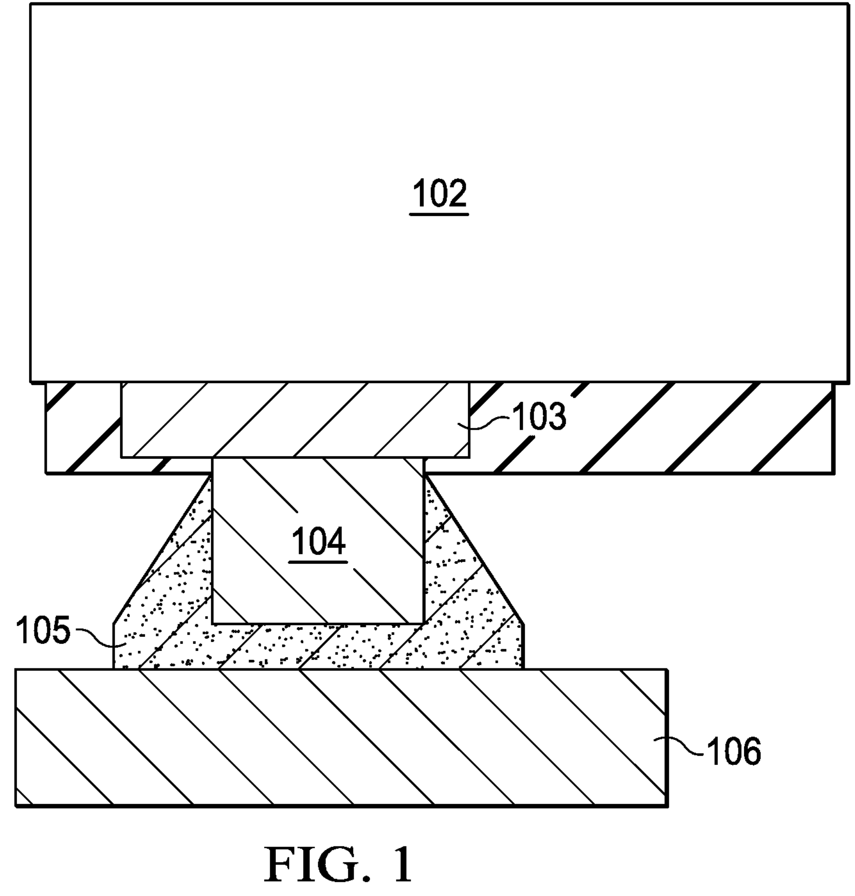
FIG. 1 is a cross section of a prior art flip chip joint using solder.

Other features of the present embodiments will be apparent from the accompanying drawings and from the detailed description that follows.

DETAILED DESCRIPTION OF EMBODIMENTS OF THE INVENTION

Specific embodiments of the invention will now be described in detail with reference to the accompanying figures. Like elements in the various figures are denoted by like reference numerals for consistency. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Current FCOL (flip chip on leadframe) products typically use a solder alloy to bond metallic posts formed on the semiconductor die onto a leadframe. Typically, the posts are copper (Cu) and range in size from 75 um circular to 100×300 um oval. Typically, the leadframe is copper. While a solder bond provides a good connection between the copper posts and copper leadframe, there are known solder joint quality/reliability issues. For example, infant mortality failures may occur due to voiding from the flux or the solder paste process. The adoption of lead (Pb) free solder by the industry has resulted in a more brittle solder. Thermally driven void development and growth may occur under thermal aging. Solder joint cracking may occur under temperature cycling. Additionally, the current carrying capacity of a solder joint may be less than optimum.

An improved process for producing a FCOL device will now be disclosed. An embodiment of this disclosure may print a metallic nanoparticle loaded solution onto the flip chip bumps or target substrate pads that will connect the two surfaces and be fused to form a solid metal-to-metal connection. This may result in a bond that increases the maximum current allowed in a flip chip package. This process may improve joint cracking that has resulted from brittle Pb-free solder. This improved process may also prevent solder voiding during assembly and reliability stress.

FIG. 1 is a cross section of a prior art flip chip 102 with an exemplary solder joint. At each contact region of semiconductor die 102, a metal layer 103, referred to as a "copper over anything" (COA) layer, may be deposited and then patterned to form a metalized contact region 103. A metallic post 104 is formed in contact with the metalized contact region 103. A solder dot 105 may be placed on either the post 104 or a leadframe 106 and then heated to form a solder bond between post 104 and leadframe 106 using a Thermosonic or reflow process, for example. Notice that the solder forms a layer between post 104 and leadframe 106 and thereby may limit current capacity through post 104 to or from circuitry on die 102. Furthermore, as mentioned above, if the solder is Pb free solder, then there may be a tendency for a crack to form between leadframe 106 and post 104 due to thermal cycling.

Figure 2A:
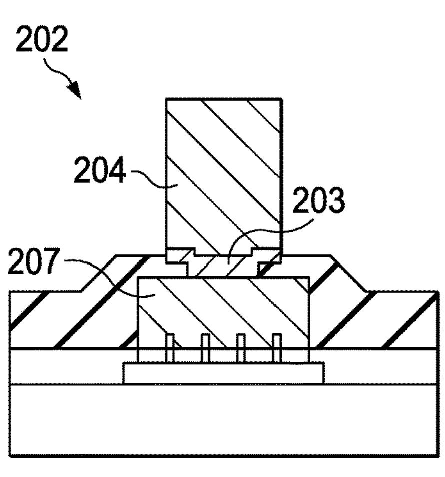
FIGS. 2A-2G are a series of cross sectional views illustrating formation of a flip chip sintered metal joint.

FIGS. 2A-2G are a series of cross sectional views illustrating formation of a flip chip sintered metal joint. In FIG. 2A, a small portion of a semiconductor die 202 is illustrated. It is to be understood that die 202 may extend to the left and to the right to include various circuitry and multiple contact regions, as is well known in the art. In this illustration, only a single contact region 207 is illustrated. On top of contact region 207, a COA copper layer has been deposited to form metal feature 203 that is in contact with contact region 207. COA layer 203 may be applied by sputtering, for example. A photo resist layer may then be applied and patterned to allow post 204 to be formed by electroplating, for example. The photo resist may then be removed to reveal post 204 extending from the surface of die 202.

Figure 2B:
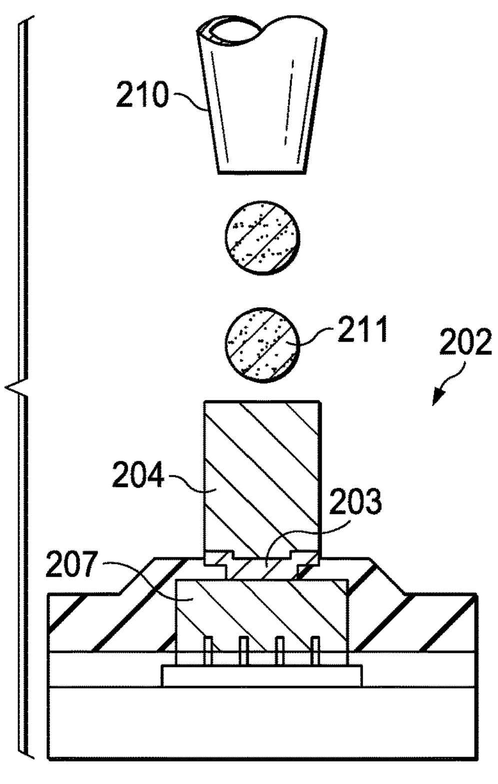

FIG. 2B illustrates an inkjet printer 210 depositing a series of droplets 211 that contain metal nanoparticles onto the metal post 204. Fabrication of three dimensional structures using ink jet printers or similar printers that can "print" various polymer materials is well known and need not be described in further detail herein. For example, see "3D printing," Wikipedia, Sep. 4, 2014. Printing allows for the rapid and low-cost deposition of thick dielectric and metallic layers, such as 0.1 um-1000 um thick, for example, while also allowing for fine feature sizes, such as 20 um feature sizes, for example.

The ink may include a solvent or several solvents to match rheology and surface tension, and metallic nanoparticles. The size of the nanoparticle may be in a range of 2-100 nm, for example. The ink may also include a dispersant such as polyvinylpyrrolidone (PVP) or be charge dispersed to prevent agglomeration of the particles. The ink may also include binders such as polymer epoxies, and other known or later developed ink additives.

The film residue that is left from the ink may then be cured in the case of solvent or dispersant based ink where solvent or dispersant is evaporated. Curing may be thermal (50-250 C), UV, Infrared, Flash Lamp, or of another form that is compatible with the ink being used.

In this example, the metal nanoparticles may be copper, or a mixture of copper and silver, for example. In another embodiment, the nanoparticles may be a mixture of copper and graphene, or copper and graphite, for example. The graphite/graphene mixtures allow for a higher current density without electromigration. In another embodiment, the nanoparticles may be copper oxide that is later reduced back copper during a sintering step that will be described in more detail below. In another embodiment, the nanoparticles may be selected to bond to a metal post formed from a different metal than copper, for example.

Figure 2C:
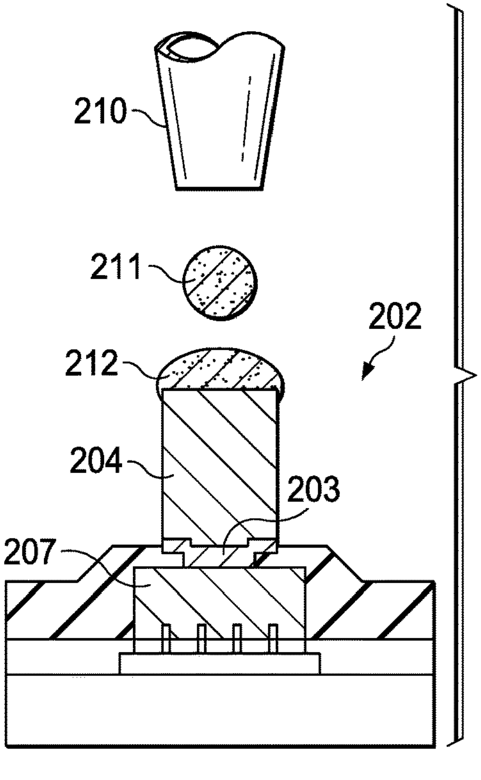
Figure 2D:
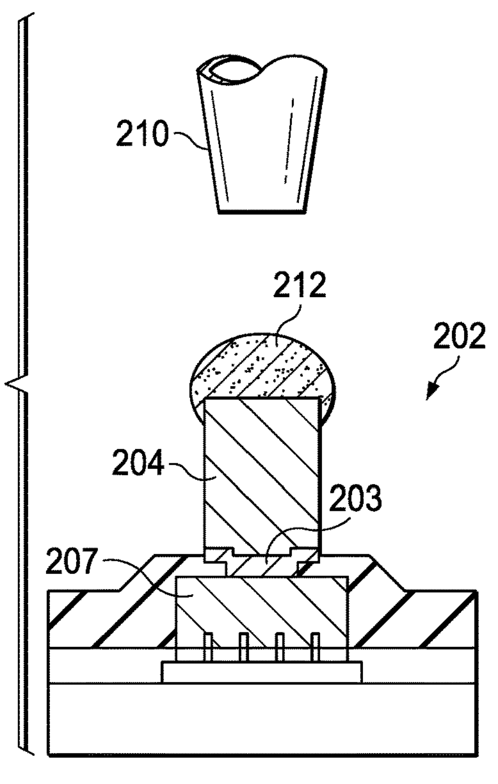

FIGS. 2C-2D illustrate how a "bead" or a "bump" 212 may build up on the top of metal post 204 formed from multiple droplets 211 dispensed from inkjet printer 210.

Figure 2E:
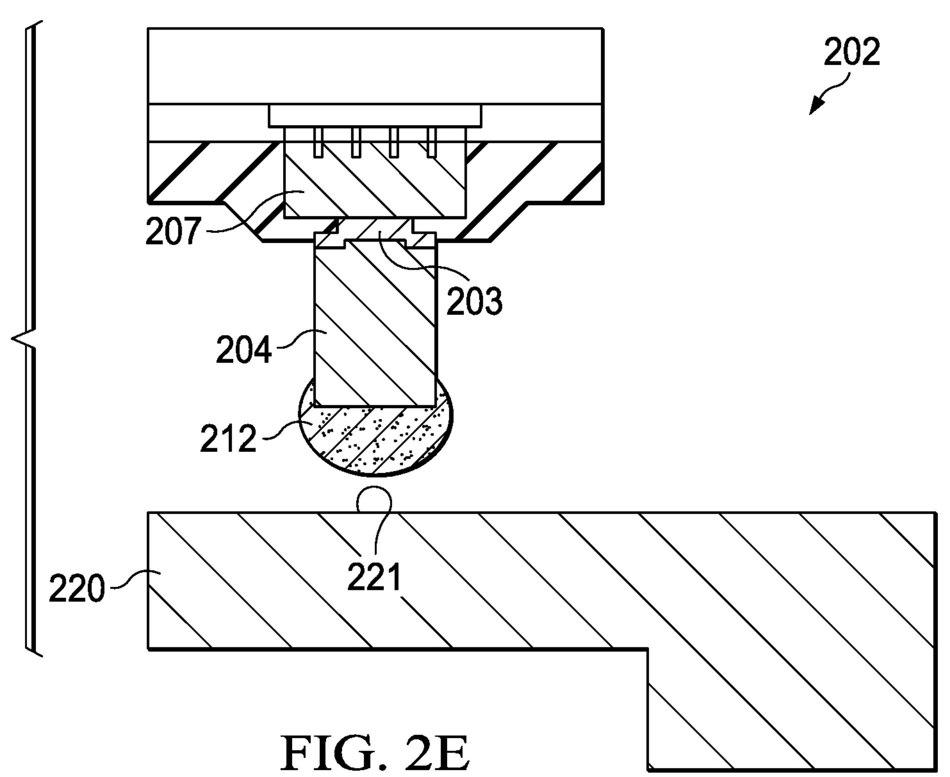
Figure 2F:
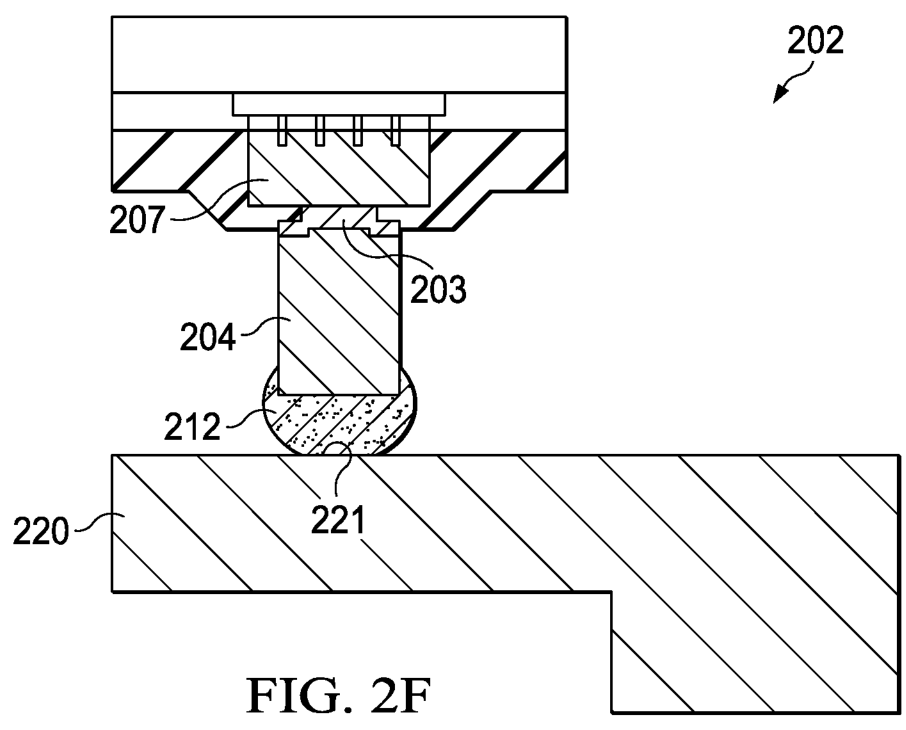
Figure 2G:
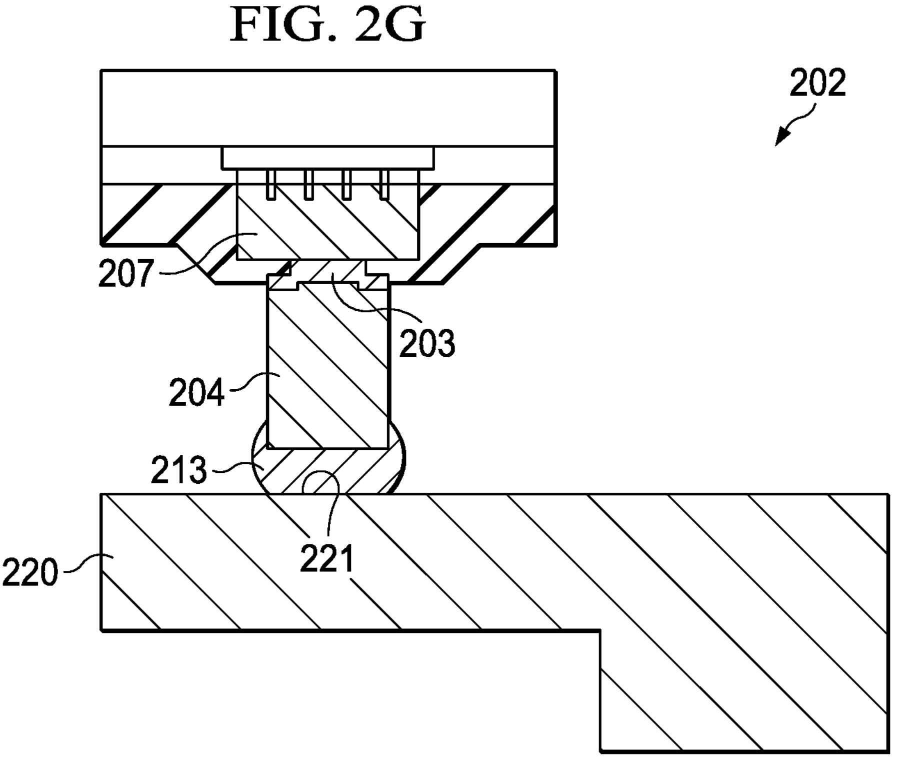

FIGS. 2E-2F illustrate how die 202 may be "flipped" and positioned over a leadframe 220. Leadframe 220 will typically have a set of leads, each of which has a contact region 221. Each post 204 is designed to align with a particular contact region 221. In these figures, only a small part of leadframe 220 is shown for clarity. The design and fabrication of leadframes is well known and need not be described in detail herein. Once the flipped die 202 is aligned with leadframe 220, it may be lowered so that each post 204 and bump 212 is brought into contact with each corresponding contact region 221.

FIG. 2F illustrates the result of a sintering process in which the bump 212 that is formed by metal nanoparticles is converted into a solid structure 213. Sintering is the process of compacting and forming a solid mass of material by heat and/or pressure without melting it to the point of liquefaction. The atoms in the materials may diffuse across the boundaries of the particles, fusing the particles together and creating one solid piece. Typically, the sintering temperature does not have to reach the melting point of the material; therefore sintering is often chosen as the shaping process for materials with extremely high melting points. Most, if not all, metals can be sintered. This applies especially to pure metals produced in vacuum which suffer no surface contamination.

Sintering the nanoparticles of bump 212 produces a solid structure 213 that forms a sintered metal bond between post 204 and contact region 221 of leadframe 220. Adhesion of the sintered metal to the metal surface of the post and lead frame may occur in three manners: (1) van der Waals forces, (2) mechanical adhesion/roughness, (3) through the nanoparticle or lead frame surface chemical diffusion into the other. Unlike a joint formed by eutectic solder, sintered metal bond 213 will not melt and degrade the bond if the die is heated a second time.

Each sintered metal bond is typically porous as a result of spaces that remain between the nanoparticles after the sintering process. However, a sintering process may be continued until porosity is reduced or eliminated. A porous sintered bond may reduce thermo-mechanical reliability risk due to an ability to flex in response to stress applied to the bond by thermal or mechanical forces. The amount of porosity may be controlled by controlling one or more aspects of the sintering process, such as: selecting the size of the nanoparticles, selecting the temperature profile or other process parameters used to perform the sintering process, etc. Another way to control porosity is to add a sacrificial nanoparticle to the ink, such as poly-methyl methacrylate, or other polymer, silica, etc; then remove these particles during the sintering or after the sintering to increase the porosity. A typical nanoparticle sintered metal bond may have a porosity of approximately 20%. Generally, porosity may be selected to fall within a range of 0%-50% while still providing good current carrying capacity and structural integrity.

Sintering may be performed in a number of ways. For example, the parts may be heated to an elevated temperature but need not be heated to the melting point of the metal that forms the nanoparticles. For example, copper nanoparticles may be heated to a range of 80-300 C to form a solid structure. For comparison, the melting point of copper is 1,085 C.

Figure 3:
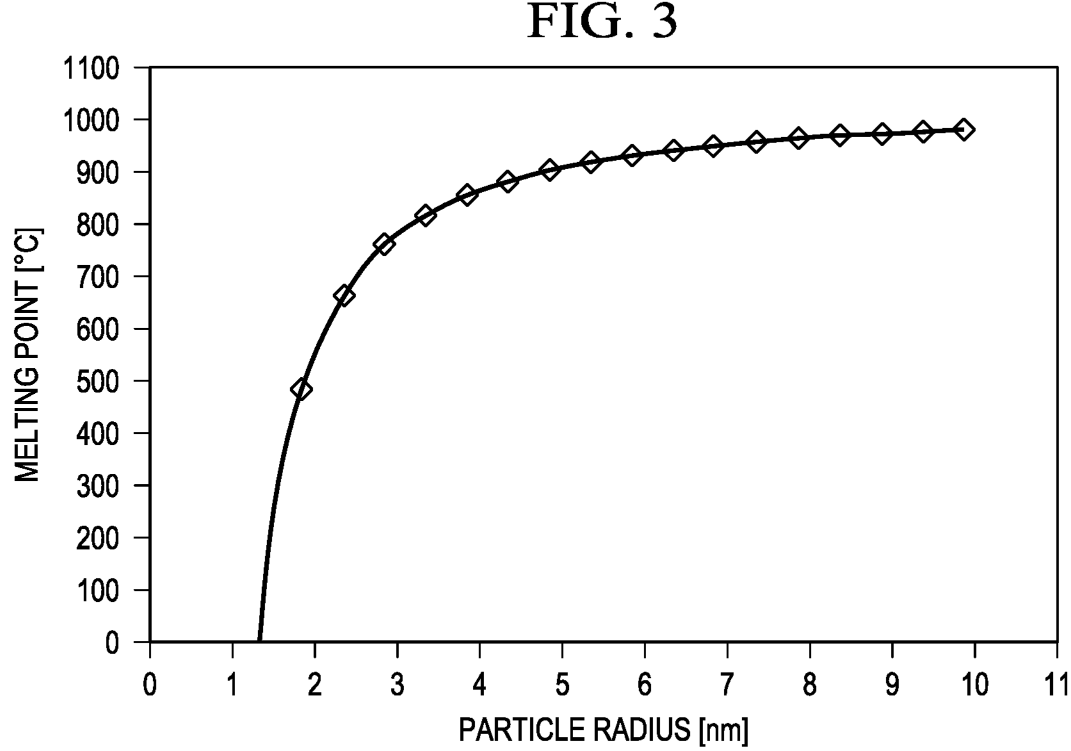
FIG. 3 is a plot illustrating melting point vs. particle size in a sintering process.

FIG. 3 is a plot illustrating melting point vs. particle size for copper nanoparticles in a sintering process. The small nanoparticles may melt together at very low temperatures; however, as they melt together they get larger which causes the "bulk" melting temperature of the nanoparticles to go up. This causes an irreversible process in which higher temperature will only make the particles get bigger and thus melt at an even higher temperature. Thus, once the small nanoparticles are melted, the resulting structure cannot be un-melted like solder, unless the melting point of the bulk metal is reached. Note in FIG. 3, while sintering may occur at a temperature range of 80-300 C for copper nanoparticles, the resulting sintered metal bond cannot be re-melted unless the temperature of the sintered metal structure is raised to 1085 C, which is the melting point of bulk copper.

In another embodiment, copper oxide nanoparticles, for example, may be sintered using a Xenon flash lamp using a known or later developed photon sintering process.

In another embodiment, copper oxide nanoparticles, for example, may be sintered in a reducing atmosphere using a known or later developed forming gas or formic acid sintering process. In this case, the copper oxide is converted back to pure copper by the formic acid process. Typically, this process may be performed at a temperature in the range of 200-250 C.

FIGS. 4A-4D are a series of cross sectional views of another embodiment in which a sintered metal bond is formed. In this embodiment, a bump 412 may be formed on each contact region of leadframe 420 by depositing a series of droplets 411 that contain metal nanoparticles onto the contact region 421 of leadframe 420 by an inkjet printer 210. As described above, the metal nanoparticles may be copper, or a mixture of copper and silver, or other metals, for example. In another embodiment, the nanoparticles may be a mixture of copper and graphene, or copper and graphite, for example. The graphite/graphene mixtures allow for a higher current density without electromigration. In another embodiment, the nanoparticles may be copper oxide that is later reduced back copper during a sintering step that will be described in more detail below. In another embodiment, the nanoparticles may be selected to bond to a metal post formed from a different metal than copper, for example.

Figure 4A:
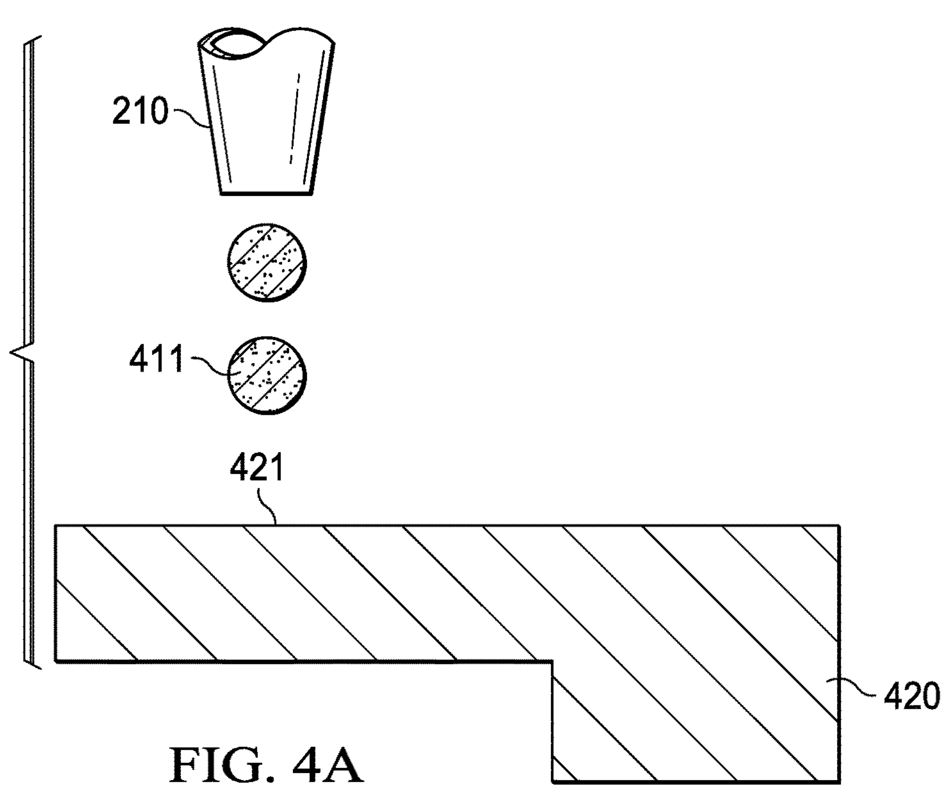
FIGS. 4A-4D are a series of cross sectional views of another embodiment in which a sintered metal bond is formed.
Figure 4B:
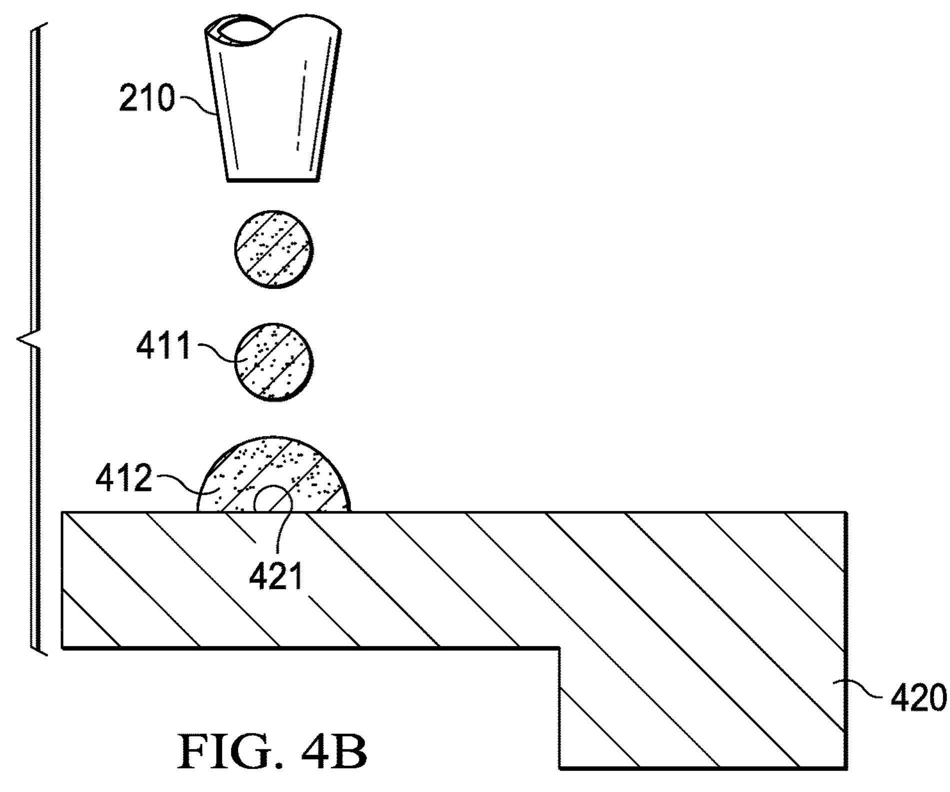
Figure 4C:
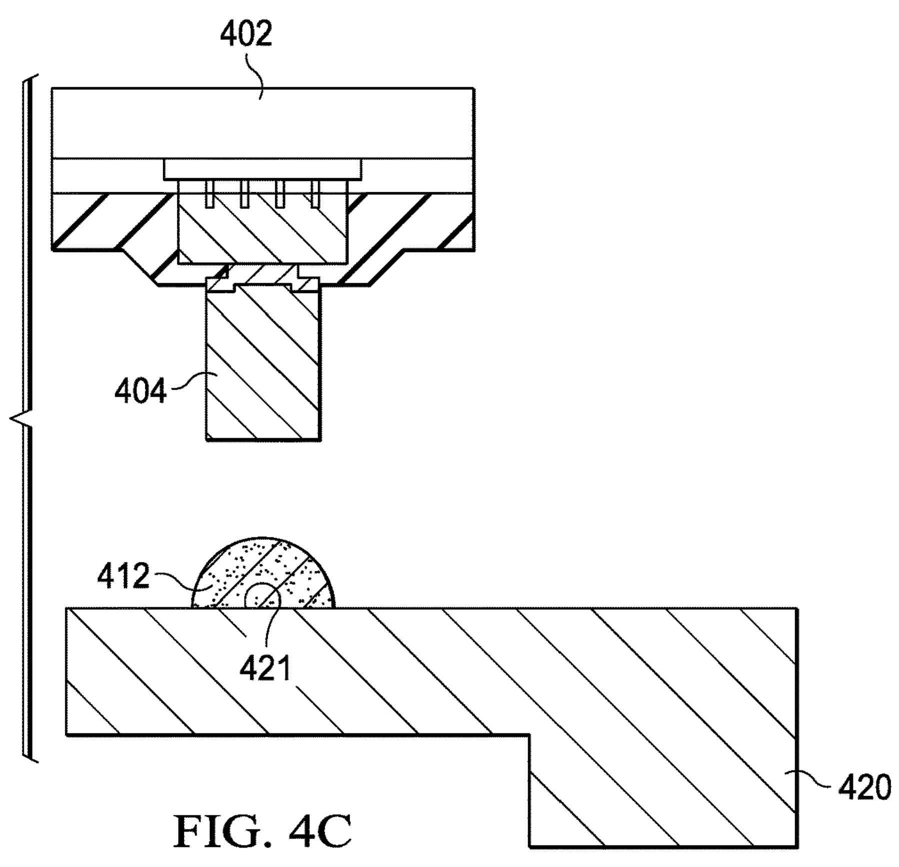

FIG. 4C illustrates how die 402 may be "flipped" and positioned over leadframe 420. Die 402 may be similar to die 202 with a post 404 formed on each contact region of die 402 as described above in more detail. Leadframe 420 will typically have a set of leads, each of which has a contact region 421. Each post 404 is designed to align with a particular contact region 421. In these figures, only a small part of leadframe 420 is shown for clarity. The design and fabrication of leadframes is well known and need not be described in detail herein. Once the flipped die 402 is aligned with leadframe 420, it may be lowered so that each post 404 is brought into contact with each corresponding bump 412 on contact region 421.

Figure 4D:
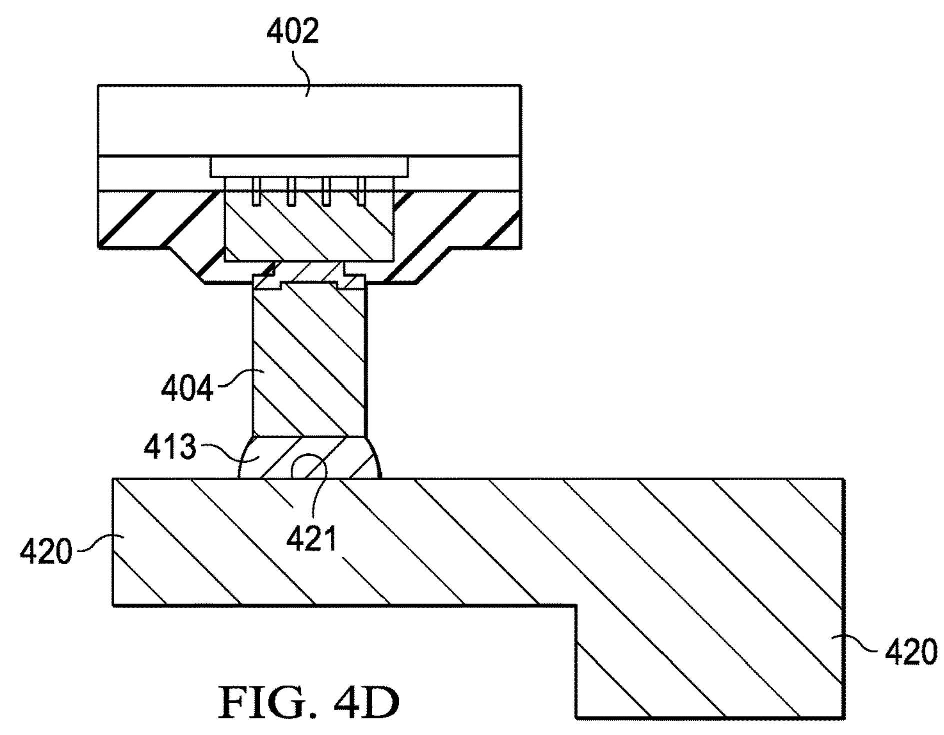

FIG. 4D illustrates the result of a sintering process in which the bump 412 that is formed by metal nanoparticles is converted into a solid structure 413. As described above, sintering is the process of compacting and forming a solid mass of material by heat and/or pressure without melting it to the point of liquefaction. Sintering the nanoparticles of bump 412 produces a solid structure 413 that forms a sintered metal bond between post 404 and contact region 421 of leadframe 420. Unlike a joint formed by eutectic solder, sintered metal bond 413 will not melt and ruin the bond if the die is heated a second time.

Figure 5:
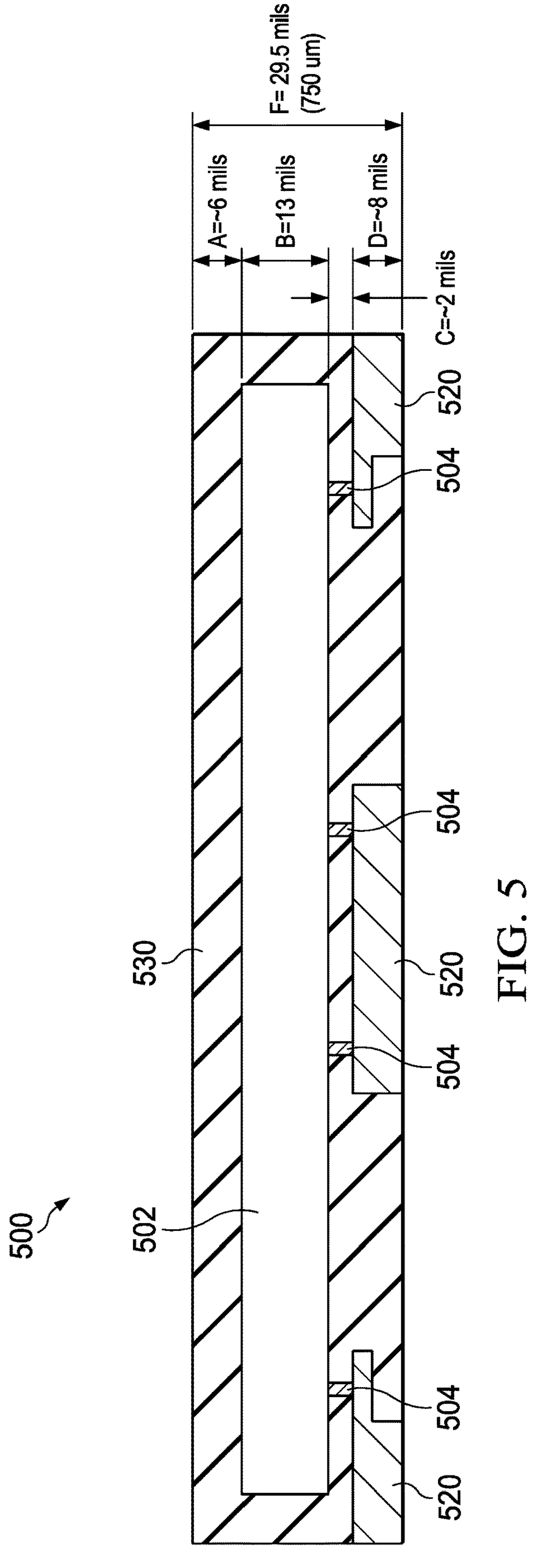
FIG. 5 is a cross sectional view of a completed integrated circuit.

FIG. 5 is a cross sectional view of a completed integrated circuit 500. Integrated circuit 500 may be formed using the sintered metal bonding process described in either FIG. 2A-2G or 4A-4D. Semiconductor die 502 includes circuitry that may be connected to a plurality of contact pads on which is formed a plurality of metal posts 504. A plurality of bumps may be formed on a plurality of contact regions of leadframe 520 or on the posts 504, in which the plurality of bumps are formed with a material that includes metal nanoparticles. IC die 502 may be attached to leadframe 520 by aligning the metal posts 504 to the leadframe and sintering the metal nanoparticles in the plurality of bumps to form a sintered metal bond between each metal post and contact region of the leadframe, as described above in more detail.

In another embodiment, a portion of the plurality of bumps may be formed on a portion of the posts and another portion of the plurality of bumps may be formed on a portion of the contact regions of the leadframe, for example.

Once die 502 is attached to leadframe 520, a molding process may be performed to encapsulate the die and leadframe to form finished IC 500. The process of encapsulation is well known and need not be described herein.

Finished IC 500 may be mounted on a substrate, such as a fiberglass printed circuit board, a ceramic circuit board, or any other known or later developed type of single layer or multilayer system substrate on which are formed various signal traces. Other ICs and electronic components may also be mounted on the substrate to form an electronic device or system, for example.

Some integrated circuits have no-lead packages such as quad-flat no-leads (QFN) and dual-flat no-leads (DFN) devices that physically and electrically couple integrated circuits to printed circuit boards. Flat no-lead devices, also known as micro leadframe (MLF) and small outline no-leads (SON) devices are based on a surface-mount technology that connects integrated circuits to the surfaces of printed circuit boards without through-holes in the printed circuit boards. In some examples, flat no-lead packages are near chip scale plastic encapsulated packages typically fabricated with a planar copper leadframe substrate. Perimeter lands on the package provide electrical coupling to the printed circuit board. The lands serve as contacts and may be referred to as leads internal to the integrated circuit; however, the leads do not extend beyond the boundaries of the integrated circuit package.

Figure 6:
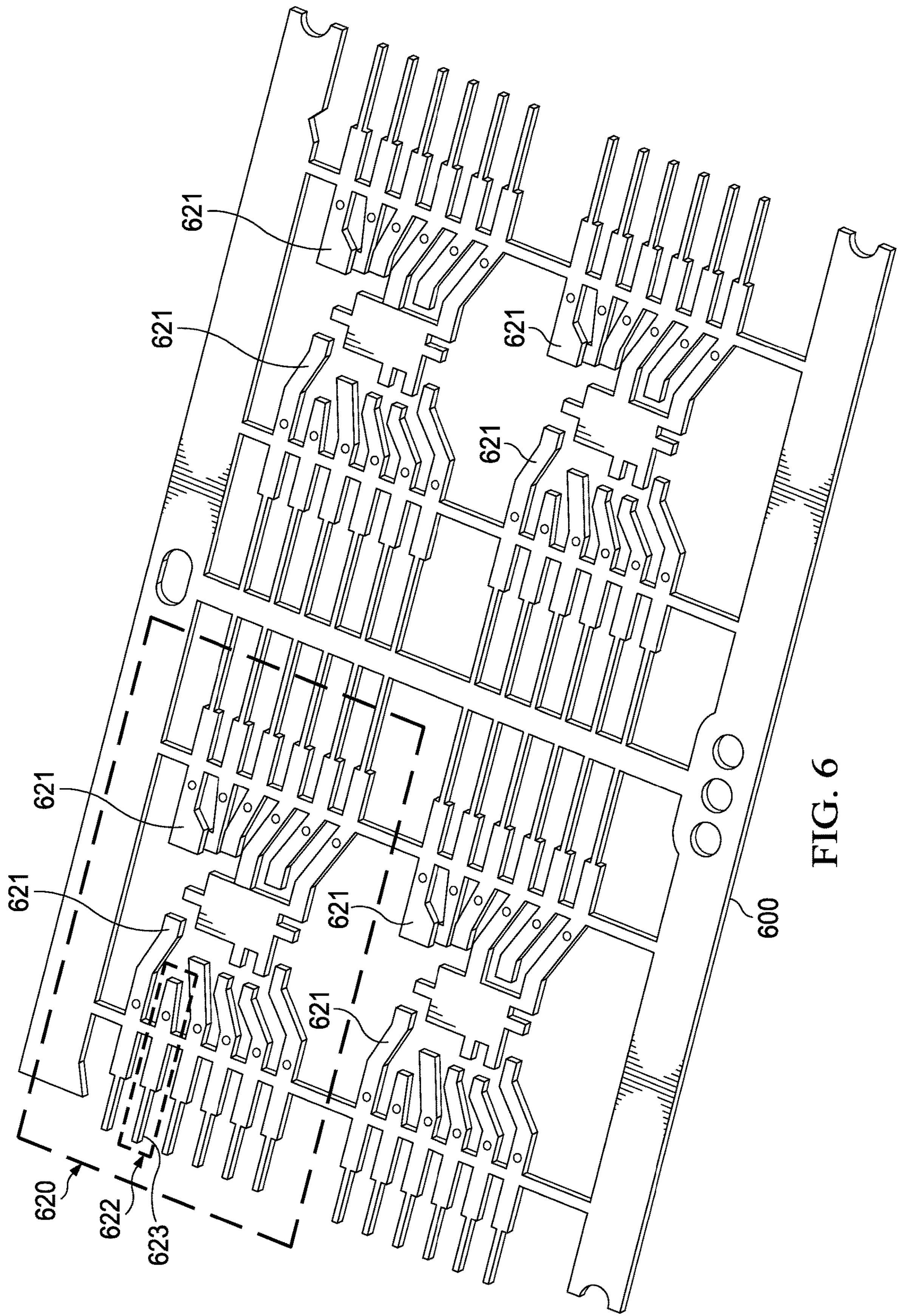
FIG. 6 is an illustration of a portion of a leadframe strip.

FIG. 6 is an illustration of a portion of a leadframe strip 600 that illustrates four repetitions of a leadframe 620. Each leadframe 620 includes a set of leads, such as lead 622, that may transition into a corresponding set of pins, such as pin 623. Each lead has a contact region 621 that is intended to align with a post on a semiconductor die. As described above in more detail, dots of metallic nanoparticle material may be added to each contact region 621 on each leadframe 620 by an inkjet process, for example. Alternatively, another additive process may be used to create the metallic nanoparticle bumps, such as: screen printing, electrostatic spraying, etc.

In this manner, an IC may be fabricated and attached to a leadframe in which sintered metal bonds are formed between the contacts on the IC die and the contact regions of the leadframe. Sintering may be performed at a temperature that is much lower than the melting point of the metal nanoparticles being use. This allows the use of organic substrates for the leadframe structure or other substrate structure, for example, that would not withstand a higher temperature process.

A sufficient volume of nanoparticle material may be printed for each bump in order to compensate for expected non-coplanarity of the die to substrate surface.

Sintering eliminates the problem of intermetallic growth between copper and tin-based Pb-free solder. Brittle solder fatigue and thermally activated void growth in solder may be eliminated by the sintered metal bond. Current carrying capacity of the joint may also be enhanced.

Other Embodiments

While the invention has been described with reference to illustrative embodiments, this description is not intended to be construed in a limiting sense. Various other embodiments of the invention will be apparent to persons skilled in the art upon reference to this description. For example, while copper posts and leadframes were described herein, other embodiments may use other types of metal for the posts and/or leadframes, such as aluminum, gold, nickel, etc.

Different metallic nanoparticles may be used in various embodiments, such as: copper, copper-silver hybrid, copper oxide, copper graphite, copper graphene, etc.

Figure 7A:
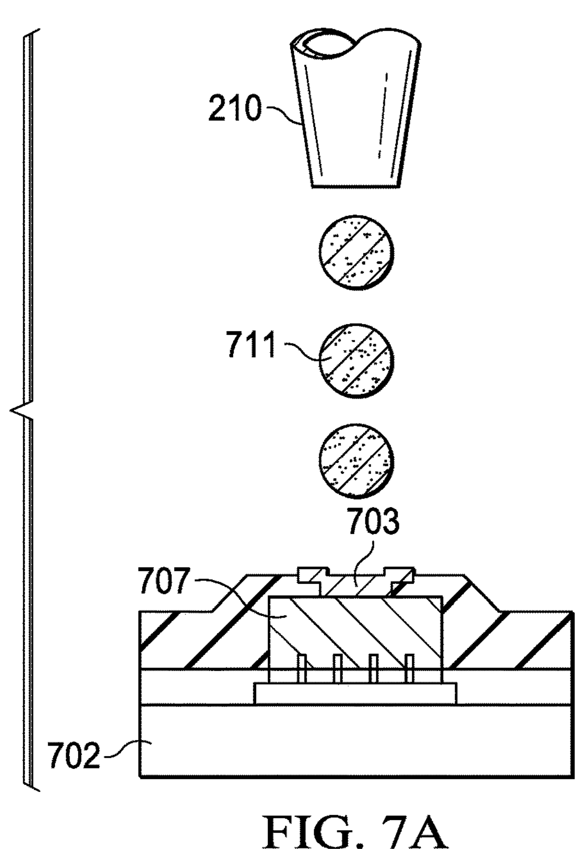
FIGS. 7A-7B illustrate another embodiment for forming posts.
Figure 7B:
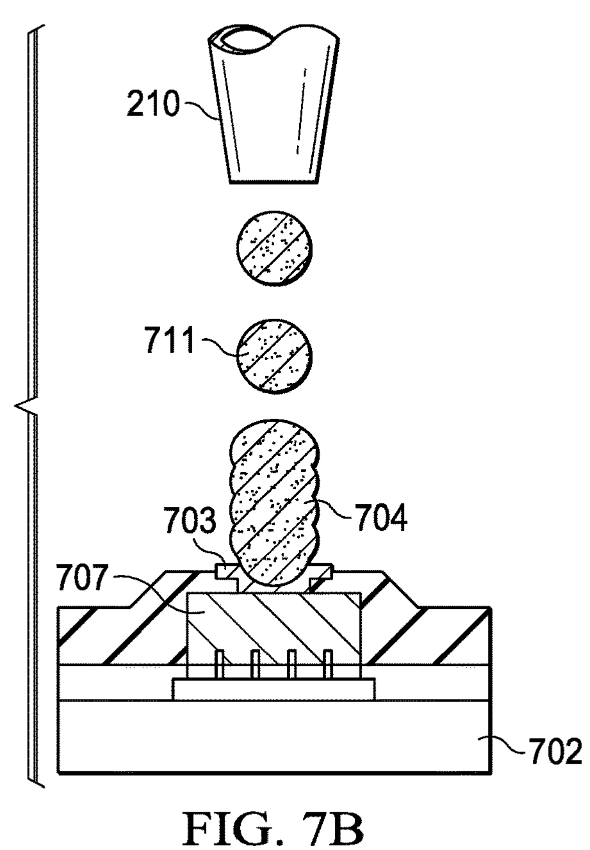

FIGS. 7A-7B illustrate another embodiment for forming posts. While printing of a nanoparticle bump on top of a solid metal post was described herein, in another embodiment the entire post, or a significant portion of the post may be formed by inkjet printing the nanoparticle material, for example. In FIG. 7A, a small portion of a semiconductor die 702 is illustrated. It is to be understood that die 702 may extend to the left and to the right to include various circuitry and multiple contact regions, as is well known in the art. In this illustration, only a single contact region 707 is illustrated. On top of contact region 707, a COA copper layer has been deposited to form metal feature 703 that is in contact with contact region 707. COA layer 703 may be applied by sputtering, for example. A photo resist layer may then be applied and patterned to form metal region 703.

A stream of ink droplets 711 may then be applied to metal region 703 by inkjet printer 210 to form a metallic post 704. After die 702 is attached to a leadframe or other substrate, a sintering process as described above may be used to convert post 704 into a solid sintered metal post that is bonded to the leadframe, as described above in more detail.

Figure 8:
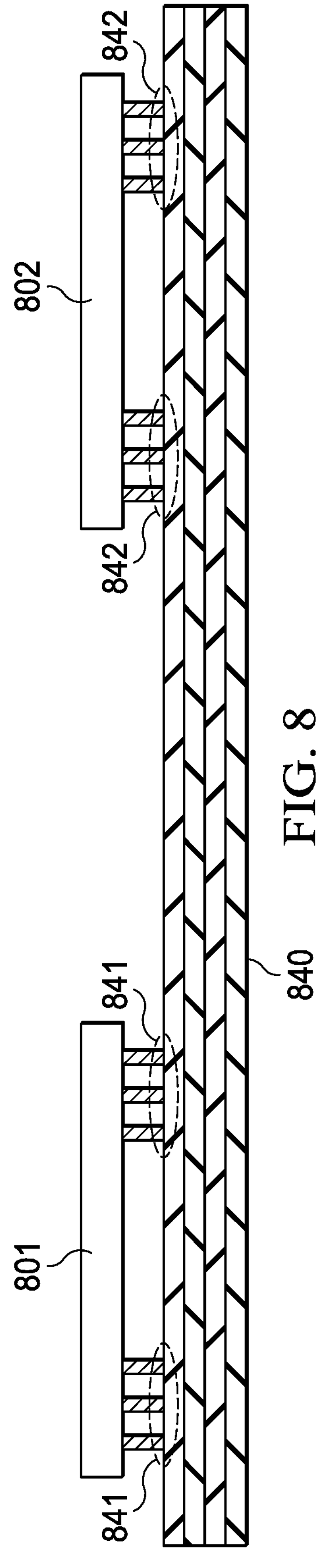
FIG. 8 is an illustration of multiple IC dies mounted to a substrate using sintered metal bonds.

FIG. 8 is an illustration of two semiconductor dies 801, 802 mounted to a multilayer substrate 840. While mounting a semiconductor die to a stamped or etched metal leadframe was illustrated herein, in other embodiments the leadframe may be a multilayer substrate that has contact areas patterned onto it, for example. In such an embodiment, the substrate 840 may extend beyond the semiconductor die and there may be two or more ICs and/or other electronic components mounted on the substrate. The substrate may be a fiberglass printed circuit board, a ceramic circuit board, or any other known or later developed type of single layer or multilayer system substrate on which are formed various signal traces, for example. In this case, nanoparticle bumps such as bumps 841, 842 may be formed on each of the dies as described with regard to FIGS. 2A-2D, or may be formed on the substrate as described with respect to FIGS. 4A-4B, for example. After the dies 801, 802 are mounted on substrate 840, all of the nanoparticle bumps may be sintered as described above in a single operation to form sintered metal bonds between the contact regions on the substrate and the contact posts on the dies.

While embodiments disclosed herein refer to flip chip configurations, other embodiments may be formed using sintered metal bonds, such as: stacked dies, dies with through silicon vias, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

What is claimed is:

1. A method for fabricating an integrated circuit, the method comprising:

forming metal interconnects on at least one of: first contact regions on a semiconductor die, or second contact regions of a metallic leadframe of the integrated circuit, in which the metal interconnects include metal nanoparticles, wherein the metal nanoparticles comprise copper nanoparticles and either graphene nanoparticles or graphite nanoparticles;

coupling the metal interconnects between the first contact regions and the second contact regions;

sintering the metal nanoparticles to form a sintered metal bond between the metal interconnects and at least one of the first or second contact regions.

2. The method of claim 1, wherein the sintering the metal bond is porous.

3. The method of claim 2, wherein the sintered metal bonds each has a porosity ranging from 0%-50%.

4. The method of claim 1, wherein a first portion of the metal nanoparticles is formed on the first contact regions, and a second portion of the metal nanoparticles is formed on the second contact regions.

5. The method of claim 1, wherein forming the metal interconnects includes depositing droplets of the metal nanoparticles with an inkjet printer.

6. The method of claim 1, wherein sintering the metal nanoparticles includes at least one of: heating the metal nanoparticles, illuminating the metal nanoparticles, or exposing the metal nanoparticles to an acid.

7. The method of claim 1, wherein forming the metal interconnects comprises:

forming metal posts on the first contact regions as first parts of the metal interconnects; and forming bumps of the metal nanoparticles on the metal posts as second parts of the metal interconnects; and wherein coupling the metal interconnects between the first contact regions and the second contact regions includes bringing the bumps of the metal nanoparticles and the second contact regions into contact.

8. The method of claim 1, further comprising:

forming metal posts on the first contact regions as the metal interconnects; and forming bumps of the metal nanoparticles on the second contact regions, wherein coupling the metal interconnects between the first contact regions and the second contact regions includes bringing the bumps of the metal nanoparticles and the second contact regions into contact.

9. The method of claim 1, further comprising:

forming columns of the metal nanoparticles on the first contact regions as the metal interconnects, wherein coupling the metal interconnects between the first contact regions and the second contact regions includes bringing the columns of the metal nanoparticles and the second contact regions into contact.

10. The method of claim 1, further comprising:

forming columns of the metal nanoparticles on the second contact regions as the metal interconnects, wherein coupling the metal interconnects between the first contact regions and the second contact regions includes bringing the columns of the metal nanoparticles and the first contact regions into contact.

11. The method of claim 1, wherein the sintering the metal nanoparticles causes a portion of the metal nanoparticles to diffuse into at least one of the first or second contact regions.

12. The method of claim 1, wherein the semiconductor die is flip chip connected to the metallic leadframe.

13. The method of claim 1, further comprising mounting the integrated circuit on a circuit board.

14. The method of claim 6, wherein the sintering the metal nanoparticles comprises illuminating the metal nanoparticles.

15. The method of claim 1, further comprising encapsulating the semiconductor die, the metallic leadframe, and the metal interconnects with a molding compound, at least a portion of the molding compound between the semiconductor die and the metallic leadframe.

16. A method comprising:

forming metal interconnects on at least one of: first contact regions on a semiconductor die, or second contact regions of a metallic leadframe of an integrated circuit, in which the metal interconnects include copper oxide nanoparticles;

coupling the metal interconnects between the first contact regions and the second contact regions; and forming a metal bond between the metal interconnects and at least one of the first or second contact regions, wherein the forming the metal bond comprises reducing the copper oxide nanoparticles to copper nanoparticles.

17. A method comprising:

forming metal interconnects on at least one of: first contact regions on a semiconductor die, or second contact regions of a metallic leadframe of an integrated circuit, in which the metal interconnects include metal nanoparticles, wherein the metal nanoparticles comprise a sacrificial nanoparticles;

coupling the metal interconnects between the first contact regions and the second contact regions;

sintering the metal nanoparticles to bond between the metal interconnects and at least one of the first or second contact regions; and removing the sacrificial nanoparticles.

18. The method of claim 17, wherein removing the sacrificial nanoparticles is performed while sintering the metal nanoparticles.

19. The method of claim 17, wherein removing the sacrificial nanoparticles is performed after sintering the metal nanoparticles.

20. The method of claim 17, wherein the sacrificial nanoparticles include a polymer or silica.

* * * * *